US011913998B2

(12) United States Patent
Itakura et al.

(10) Patent No.: US 11,913,998 B2
(45) Date of Patent: *Feb. 27, 2024

(54) MANAGEMENT DEVICE AND POWER SUPPLY SYSTEM

(71) Applicant: Panasonic Intellectual Property Management Co., Ltd., Osaka (JP)

(72) Inventors: Yusuke Itakura, Nara (JP); Changhui Yang, Osaka (JP); Shinya Nishikawa, Osaka (JP); Tohru Watanabe, Gifu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 585 days.

This patent is subject to a terminal disclaimer.

(21) Appl. No.: 17/261,101

(22) PCT Filed: Jun. 12, 2019

(86) PCT No.: PCT/JP2019/023181
§ 371 (c)(1),
(2) Date: Jan. 18, 2021

(87) PCT Pub. No.: WO2020/021888
PCT Pub. Date: Jan. 30, 2020

(65) Prior Publication Data
US 2021/0318386 A1 Oct. 14, 2021

(30) Foreign Application Priority Data
Jul. 25, 2018 (JP) .................................. 2018-139366

(51) Int. Cl.
*G01R 31/388* (2019.01)
*G01R 31/392* (2019.01)
(Continued)

(52) U.S. Cl.
CPC ............ *G01R 31/388* (2019.01); *B60L 58/20* (2019.02); *G01R 31/392* (2019.01); *H01M 10/48* (2013.01); *H02J 7/00* (2013.01)

(58) Field of Classification Search
CPC ..... G01R 31/388; G01R 31/392; B60L 58/20; H01M 10/48; H02J 7/00
(Continued)

(56) References Cited

U.S. PATENT DOCUMENTS 5,448,154 A * 9/1995 Kanke ................... H02J 7/2434
322/28
8,283,894 B2 * 10/2012 Matsuura ............. G01R 31/396
320/136
(Continued)

FOREIGN PATENT DOCUMENTS

JP 2002-334726 11/2002
JP 2008307973 A * 12/2008
(Continued)

OTHER PUBLICATIONS

Fujita et al., Japanese Patent Document No. JP-5980457-B1, published Aug. 31, 2016, 3 pages including novelty and claims. (Year: 2016).*

(Continued)

*Primary Examiner* — Phallaka Kik
(74) *Attorney, Agent, or Firm* — Rimon P.C.

(57) ABSTRACT

Provided is a controller configured: to calculate, among voltages detected from a plurality of cells, a voltage difference between the voltage detected from one cell of the plurality of cells, the one cell to be detected, and a representative voltage at each of a first time and a second time, the representative voltage based on the voltage detected from at least one cell of the plurality of cells, the at least one cell to be compared; and when a discrepancy between the
(Continued)

voltage difference at the first time and the voltage difference at the second time is equal to or more than a threshold, to determine that an abnormality has occurred in the one cell to be detected. The controller refers to a state-of-charge versus open-circuit-voltage (SOC-OCV) curve of the one cell to be detected in accordance with a state-of-health (SOH) of the one cell to be detected, so as to estimate an SOC as initial capacitance reference of the one cell to be detected in correspondence to the voltage detected from the one cell to be detected. The controller introduces a linear function using an SOC as initial capacitance reference as an input variable, using an OCV as an output variable, and having a predetermined inclination, and applies the SOC as initial capacitance reference of the one cell to be detected that the controller has estimated to the linear function, so as to derive an OCV. Then, in place of the voltage detected from the one cell to be detected, the controller uses the OCV that the controller has derived, so as to calculate the voltage difference at the first time and the voltage difference at the second time.

5 Claims, 6 Drawing Sheets

(51) Int. Cl.
*B60L 58/20* (2019.01)
*H01M 10/48* (2006.01)
*H02J 7/00* (2006.01)

(58) Field of Classification Search
USPC .................. 320/132, 134, 136, 161, 162
See application file for complete search history.

(56) References Cited

U.S. PATENT DOCUMENTS

| | | | | |
|---|---|---|---|---|
| 10,838,013 B2* | 11/2020 | Tenmyo | ............... | H01M 10/482 |
| 2004/0001996 A1* | 1/2004 | Sugimoto | ........... | H01M 10/482 |
| | | | | 429/61 |
| 2004/0239333 A1* | 12/2004 | Kikuchi | .............. | H01M 10/486 |
| | | | | 324/434 |
| 2004/0247964 A1* | 12/2004 | Sadamoto | ......... | H01M 8/04671 |
| | | | | 429/432 |
| 2007/0182348 A1* | 8/2007 | Ooishi | ................... | H02J 7/005 |
| | | | | 318/54 |
| 2007/0202371 A1* | 8/2007 | Takeda | ................. | G01R 31/396 |
| | | | | 429/432 |
| 2009/0315520 A1* | 12/2009 | Nishiyama | ....... | G01R 19/16542 |
| | | | | 429/61 |
| 2010/0004885 A1* | 1/2010 | Nakanishi | .......... | G01R 31/3842 |
| | | | | 324/426 |
| 2010/0308834 A1* | 12/2010 | Kawai | ..................... | H01M 4/13 |
| | | | | 324/433 |
| 2010/0321026 A1* | 12/2010 | Matsuura | ............. | G01R 31/396 |
| | | | | 324/434 |
| 2011/0121789 A1* | 5/2011 | Yang | ......................... | H02J 7/04 |
| | | | | 320/152 |
| 2012/0139522 A1* | 6/2012 | Hasegawa | ............... | H02M 1/32 |
| | | | | 323/311 |
| 2012/0212183 A1* | 8/2012 | Yamada | .................... | H02J 3/32 |
| | | | | 320/134 |
| 2012/0235687 A1* | 9/2012 | Abe | ....................... | H02J 7/0047 |
| | | | | 324/537 |
| 2013/0039108 A1* | 2/2013 | Watanabe | ................ | H02M 7/48 |
| | | | | 363/131 |
| 2013/0110430 A1* | 5/2013 | Nishi | .................... | G01R 31/382 |
| | | | | 702/63 |
| 2013/0234672 A1* | 9/2013 | Kubota | .............. | G01R 31/3835 |
| | | | | 320/134 |
| 2014/0111160 A1* | 4/2014 | Nozawa | ............. | G01R 31/3835 |
| | | | | 320/167 |
| 2017/0117596 A1* | 4/2017 | Kubo | .................. | H01M 10/482 |
| 2018/0006340 A1* | 1/2018 | Yamamoto | ............ | B60L 3/0084 |
| 2018/0056809 A1* | 3/2018 | Uchida | .................... | B60L 58/22 |
| 2019/0187221 A1* | 6/2019 | Mukuno | ............. | G01R 31/367 |
| 2019/0372081 A1* | 12/2019 | Lopez De Arroyabe | ..................... | H01M 50/54 |
| 2020/0225268 A1* | 7/2020 | Nagayasu | .......... | G01R 27/2605 |
| 2021/0296911 A1* | 9/2021 | Itakura | ............... | G01R 31/3835 |
| 2021/0404146 A1* | 12/2021 | Ishida | ................... | H02J 7/0048 |

FOREIGN PATENT DOCUMENTS

| | | | |
|---|---|---|---|
| JP | 2016099251 A | * | 5/2016 |
| JP | 2017129402 A | * | 7/2017 |
| JP | 2017181325 A | * | 10/2017 |
| WO | WO-2008152875 A1 | * | 12/2008 |
| WO | WO-2017217092 A1 | * | 12/2017 |

OTHER PUBLICATIONS

International Search Report of PCT application No. PCT/JP2019/023181 dated Aug. 20, 2019.

* cited by examiner

FIG. 1
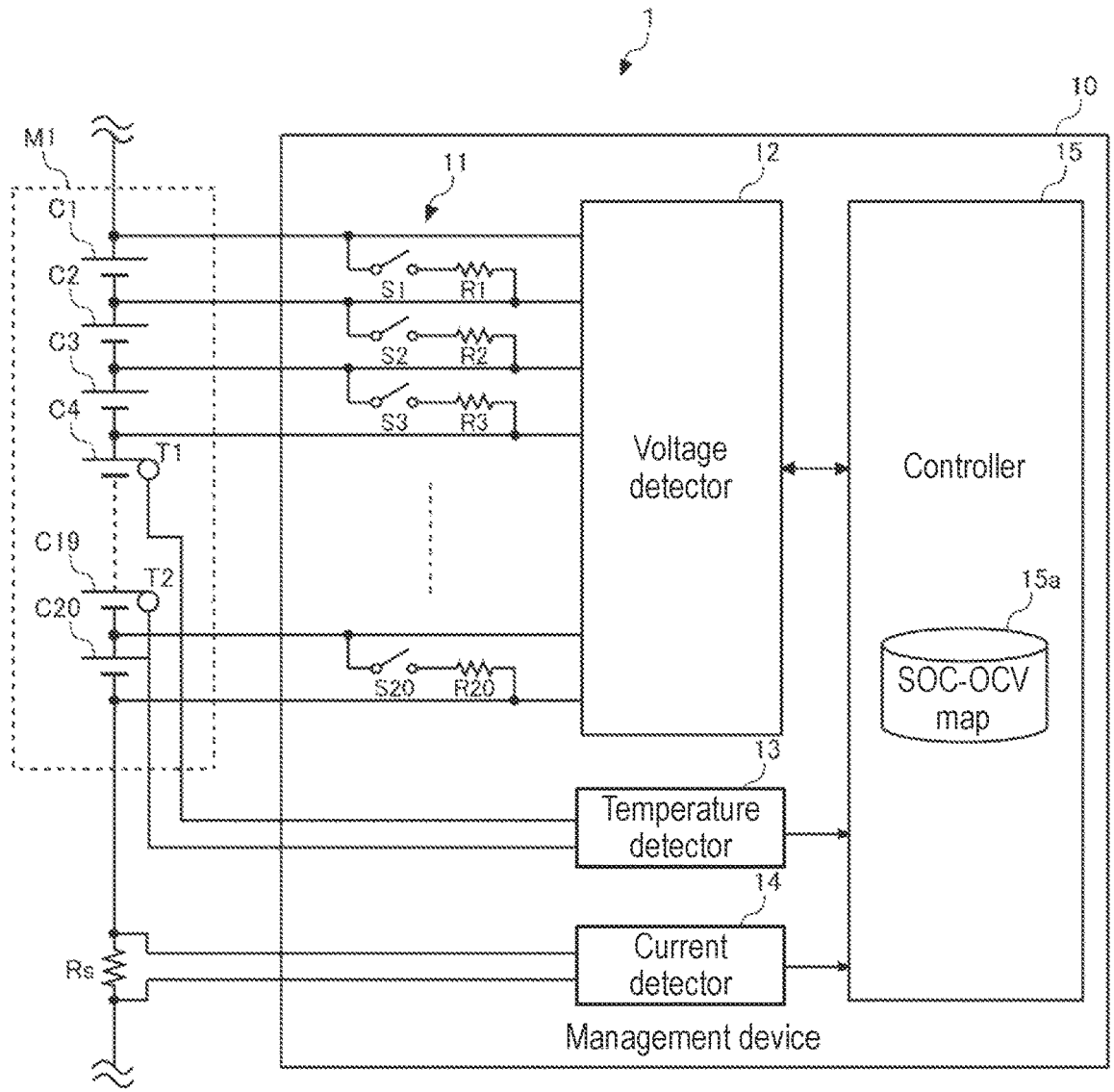
FIG. 2  (a)  (b)
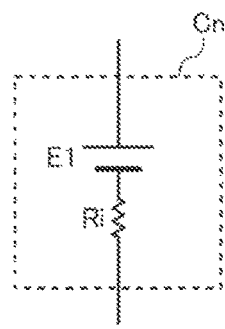
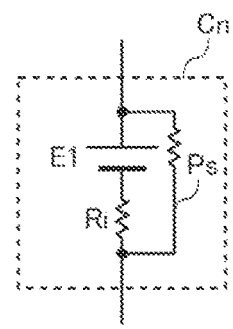
Normal cell                 Minute short-circuited cell

MANAGEMENT DEVICE AND POWER SUPPLY SYSTEM

CROSS-REFERENCE TO RELATED APPLICATIONS

This application is a U.S. national stage application of the PCT International Application No. PCT/JP2019/023181 filed on Jun. 12, 2019, which claims the benefit of foreign priority of Japanese patent application No. 2018-139366, filed on Jul. 25, 2018, the contents all of which are incorporated herein by reference.

TECHNICAL FIELD

The present invention relates to a management device and a power supply system including the management device. The management device is configured to control a plurality of cells included in a power storage module.

BACKGROUND ART

In recent years, a secondary battery, such as a lithium ion battery or a nickel hydrogen battery, has been used for various purposes. The second batteries are used, for example, for the following purposes: on-vehicle power supply for a drive motor of a vehicle (including an electric bicycle) such as an electric vehicle (EV), a hybrid electric vehicle (HEV), or a plug-in hybrid vehicle (PHV); power storage for peak-shift or backup management; or frequency regulation (FR) for stabilizing a system frequency.

Some of the second batteries (e.g., lithium batteries) may have an occurrence of, for example, a contact between a positive electrode and a negative electrode due to displacement of a separator or a conductor path due to a foreign substance included into the batteries. As a result, a minute short circuit may occur in the batteries. The minute short circuit may cause overheat, and due to a change in orientation of the foreign substance, the condition of the batteries may be degraded from the minute short circuit to a dead short circuit.

In order to detect the minute short circuit, provided has been a method to: calculate an average voltage of all the cells in a battery pack; compare the average voltage with a voltage of each of the cells; and, when any one of the cells exhibits a voltage difference beyond a determination threshold, determine that an abnormality has occurred in the corresponding cell. However, when a state-of-charge (SOC) or a state of heath (SOH) of the cells in the battery pack varies, a fluctuation in voltage difference between the average voltage and the voltage of each of the cells is not detected under uniform conditions, and the detection of the minute short circuit is thus less accurate.

In view of this, a method has been proposed where the average voltage or the determination threshold is corrected based on the SOC or a depth of discharge (DOD) of each of the cells so that accuracy in the determination is improved (see, for example, PTL 1). The method is configured to correct a normal/abnormal range of the voltage of each of the cells that differs from that of the others due to the SOC or the DOD of the corresponding cell.

CITATION LIST

PTL 1: Unexamined Japanese Patent Publication No. 2002-334726

SUMMARY OF THE INVENTION

However, when a long-term operation or a difference in environmental conditions causes a change in degree of the variation in the SOC or the SOH among a plurality of cells, the conditions to determine the abnormality in the cells need to be modified. Here, in order to make the determination at high accuracy, the conditions for the determination need to be divided into more details.

In view of the respects described above, an object of the present invention is to provide a technique to, regardless of the variation in the SOC or the SOH among the plurality of cells, determine the abnormality in each of the cells under uniform conditions.

In order to solve the problems described above, an aspect of the present invention provides a management device including: a voltage detector configured to detect a voltage of each of a plurality of cells that are connected in series to each other; and a controller configured: to calculate, among the voltages detected from the plurality of cells, a voltage difference between the voltage detected from one cell of the plurality of cells, the one cell to be detected, and a representative voltage at each of a first time and a second time, the representative voltage based on the voltage detected from at least one cell of the plurality of cells, the at least one cell to be compared; and when a discrepancy between the voltage difference at the first time and the voltage difference at the second time is equal to or more than a threshold, to determine that an abnormality has occurred in the one cell to be detected. In the management device, the controller refers to a state-of-charge versus open-circuit-voltage (SOC-OCV) curve of the one cell to be detected in accordance with a state-of-health (SOH) of the one cell to be detected, so as to estimate an SOC as initial capacitance reference of the one cell to be detected in correspondence to the voltage detected from the one cell to be detected, the controller introduces a linear function using an SOC as initial capacitance reference as an input variable, using an OCV as an output variable, and having an inclination predetermined, and applies the SOC as initial capacitance reference of the one cell to be detected that the controller has estimated to the linear function, so as to derive an OCV, and in place of the voltage detected from the one cell to be detected, the controller uses the OCV that the controller has derived, so as to calculate the voltage difference at the first time and the voltage difference at the second time.

The present invention provides a technique to, regardless of variation in an SOC or an SOH among a plurality of cells, determine an abnormality in each of the plurality of cells under uniform conditions.

BRIEF DESCRIPTION OF DRAWINGS

FIG. 1 is a diagram showing a power supply system according to an exemplary embodiment of the present invention.

FIGS. 2(*a*) and 2(*b*) are each a diagram comparing a normal cell with a cell having a minute short circuit.

DESCRIPTION OF EMBODIMENT

Figure 3:
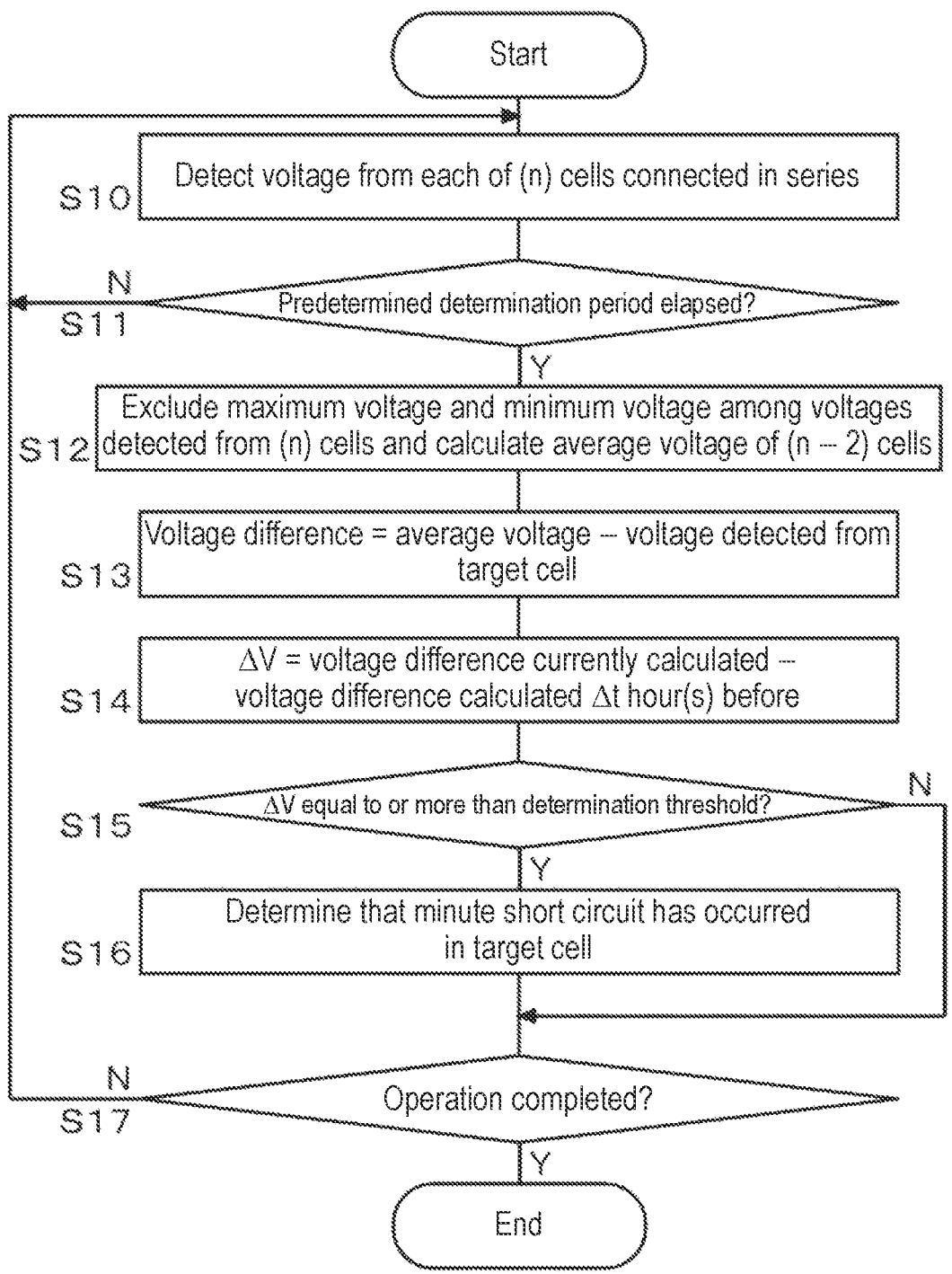
FIG. 3 is a flowchart showing a first reference example of a method for detecting the minute short circuit in a management device according to the exemplary embodiment of the present invention.

FIG. 1 is a diagram showing power supply system 1 according to an exemplary embodiment of the present invention. Power supply system 1 is, for example, mounted on a vehicle to be used as a vehicle driving battery. Power supply system 1 includes power storage module M1 and management device 10. Power storage module M1 includes a plurality of cells C1 to C20 connected in series to each other. FIG. 1 shows an example where the plurality of cells C1 to C20, i.e., 20 cells, are connected in series to form single power storage module. Each of the plurality of cells may be a lithium ion battery cell, a nickel hydrogen battery cell, a lead battery cell, an electric double layer capacitor cell, a lithium ion capacitor cell, or the like. The following description assumes an example where each of the plurality cells is a lithium ion battery cell (nominal voltage: 3.6 V to 3.7 V).

Management device 10 includes discharger 11, voltage detector 12, temperature detector 13, current detector 14, and controller 15. Discharger 11 includes a plurality of discharge switches S1 to S20 and a plurality of discharge resistors R1 to R20. Each of the plurality of cells C1 to C20 is connected in parallel to the corresponding discharger circuit. More specifically, first cell C1 is connected in series at one end to first discharge switch S1 and at the other end to first discharge resistor R1; second cell C2 is connected in series at one end to second discharge switch S2 and at the other end to second discharge resistor R2; third cell C3 is connected in series at one end to third discharge switch S3 and at the other end to third discharge resistor R3; hereinafter, the plurality of cells C4 to C18 (not shown) are respectively connected in series at one ends to the plurality of discharge switches S4 to S18 (not shown) and at the other ends to the plurality of discharge resistors R4 to R18 (not shown); nineteenth cell C19 is connected in series at one end to nineteenth discharge switch S19 (not shown) and at the other end to nineteenth discharge resistor R19 (not shown); and twentieth cell C20 is connected in series at one end to twentieth discharge switch S20 and at the other end to twentieth discharge resistor R20.

Voltage detector 12 is connected to a node of each of the plurality of cells C1 to C20 (that are connected in series to each other) via a plurality of voltage lines, and is configured to detect a voltage between an adjoining two of the plurality of voltage lines so as to detect a voltage of each of the plurality of cells C1 to C20. Voltage detector 12 transmits to controller 15 the voltage detected from each of cells C1 to C20.

Voltage detector 12 has a high voltage with respect to controller 15. Thus, voltage detector 12 is insulated and connected via a communication line to controller 15. Voltage detector 12 may be an application specific integrated circuit (ASIC) or a general-purpose analog front end IC. Voltage detector 12 includes a multiplexer and an analog-to-digital (A/D) converter. The multiplexer outputs to the A/D converter the voltages between the adjoining twos of the plurality of voltage lines, sequentially from the top of the plurality of voltage lines. The A/D converter converts each of the voltages (analog voltages) input by the multiplexer into a digital value.

Temperature detector 13 includes a voltage dividing resistor and an A/D converter. The A/D converter sequentially converts a plurality of analog voltages, having been divided by a plurality of temperature sensors T1 and T2 (e.g., thermistors) and a plurality of voltage dividing resistors, into digital values. Then, the A/D converter sequentially outputs the digital values to controller 15. Controller 15 estimates a temperature of each of the plurality of cells C1 to C20 based on the corresponding digital value. For example, controller 15 estimates the temperature of each of cells C1 to C20 based on a value detected by one of the temperature sensors that is located closest to a corresponding one of cells C1 to C20.

Current detector 14 includes a differential amplifier and an A/D converter. The differential amplifier amplifies an end-to-end voltage of shunt resistor Rs, and outputs the end-to-end voltage to the A/D converter. The A/D converter converts the voltage input by the differential amplifier into a digital value, and outputs the digital value to controller 15. Controller 15 estimates a current flowing through each of the plurality of cells C1 to C20 based on the digital value. Note that, instead of shunt resistor Rs, a Hall element may be used.

Controller 15 internally includes an A/D converter. When controller 15 includes an analog input port, each of temperature detector 13 and current detector 14 may output the analog voltages to controller 15 where the A/D converter converts each of the analog voltages into the digital value.

Controller 15 is configured to control a state of each of the plurality of cells C1 to C20 based on the voltage, the temperature, and the current of a corresponding one of cells C1 to C20, the voltage detected by voltage detector 12, the temperature detected by temperature detector 13, and the current detected by current detector 14.

Controller 15 may be a microcomputer and a non-volatile memory (e.g., an electrically erasable programmable read-only memory (EEPROM) or a flash memory). The non-volatile memory internally holds state-of-charge versus open circuit voltage (SOC-OCV) map 15a. SOC-OCV map 15a describes characteristics data for an SOC-OCV curve of each of the plurality of cells C1 to C20.

Controller 15 estimates an SOC and a state-of-health (SOH) of each of the plurality of cells C1 to C20 based on the voltage, the current, and the temperature of a corresponding one of cells C1 to C20. The SOC may be estimated based on, for example, the OCV method or the current integration method. In the OCV method, the SOC is estimated based on the OCV detected from each of the cells, and based on the characteristics data for the SOC-OCV curve held in the non-volatile memory. In the current integration method, the SOC is estimated based on the OCV detected from each of the cells at start of charge/discharge of the corresponding cell, and based on an integrated value of the current detected.

The SOH is specified based on a ratio of a current full charge capacity to an initial full charge capacity in each of the cells. When the ratio is lower (closer to 0%), the corresponding cell has degraded more significantly. Degradation of a secondary battery may be approximated by a sum of storage degradation and cycle degradation.

The storage degradation corresponds to degradation progressing over time in accordance with each of the temperature and the SOC of the secondary battery at each time point, regardless of whether or not the secondary battery is in charge/discharge. When the SOC at each time point is higher (closer to 100%) or when the temperature at each time point is higher, the storage degradation progresses more rapidly.

The cycle degradation corresponds to degradation that progresses in accordance with an increase in frequency of charge/discharge. The cycle degradation depends on a range of SOC usage, the temperature, and a current rate. When the range of SOC usage is larger, when the temperature is higher, or when the current rate is higher, the cycle degradation progresses more rapidly. As has been described above, the degradation of the secondary battery largely depends on the usage environment, and as the usage period is longer, the capacity varies more significantly among the plurality of cells C1 to C20.

Controller 15 executes a process to equalize the plurality of cells C1 to C20 based on the voltage of each of the plurality of cells C1 to C20 received from voltage detector 12. A typical passive cell balance method is used to identify, among the plurality of cells C1 to C20, one having a lowest capacity and cause the others to discharge to reach the lowest capacity (hereinafter, referred to as a target value). The target value may be specified based on any one of an actual capacity, the SOC, and the OCV. When specified based on the OCV, the target value corresponds to the OCV of one having a lowest OCV among the plurality of cells. Note that, the target value may also be specified based on a dischargeable amount or a chargeable amount.

In controller 15, the target value corresponds to a value detected from the one having the lowest capacity among the plurality of cells C1 to C20. Controller 15 calculates a difference between the target value and a value detected from each of the other cells. Based on the difference calculated, controller 15 calculates a discharge amount of each of the other cells. Based on the discharge amount calculated, controller 15 further calculates discharge time of each of the other cells. Then, controller 15 generates a control signal to equalize the plurality of cells C1 to C20 in the values above including the discharge time, and transmits the control signal to voltage detector 12. Voltage detector 12 internally includes a switch control circuit (not shown), and based on the control signal received from controller 15, the switch control circuit controls each of the plurality of discharge switches S1 to S20 to stay in an on-state for a period of time specified for the corresponding discharge switch.

Any one of the plurality of cells C1 to C20 may have a minute short circuit. The minute short circuit may cause an unsafe event such as overheat, and thus needs to be detected before the unsafe events occur.

FIGS. 2(a) and 2(b) are each a diagram comparing a normal cell with a cell having the minute short circuit. As shown in FIG. 2(a), a terminal voltage of normal cell Cn is determined by electromotive force E1 and internal resistance Ri. On the other hand, as shown in FIG. 2(b), in cell Cn having the minute short circuit (hereinafter, referred to as minute short-circuit cell Cn), minute short-circuit path Ps is formed, and a current also flows through minute short-circuit path Ps. Here, minute short-circuit path Ps causes minute short-circuit cell Cn to discharge, and additionally, internal resistance Ri causes minute short-circuit cell Cn to self-discharge. Accordingly, minute short-circuit cell Cn is greater in voltage drop than normal cell Cn.

FIG. 3 is a flowchart showing a first reference example of a method for detecting the minute short circuit in management device 10 according to the exemplary embodiment of the present invention. Voltage detector 12 detects a voltage of each of (n) cells that are connected in series, and transmits the voltage to controller 15 (S10). When a predetermined determination period (e.g., 10 minutes) has elapsed (Y in S11), controller 15 excludes a maximum voltage and a minimum voltage among the voltages detected from the (n) cells and calculates an average voltage of the (n−2) cells (S12). Controller 15 calculates a voltage difference between the average voltage calculated and the voltage detected from one of the (n) cells to be detected (hereinafter, referred to as a target cell) (S13).

Controller 15 further calculates a differential voltage $\Delta V$ between the voltage difference currently calculated and a voltage difference that has been calculated for a period of time $\Delta t$ (e.g., one hour) before (S14). Controller 15 compares the differential voltage $\Delta V$ calculated with a determination threshold (S15). The determination threshold is determined based on a resistance value of minute short-circuit path Ps (the resistance value assumed) and the period of time $\Delta t$. For example, when the resistance value of minute short-circuit path Ps is assumed to be 100Ω and the period of time $\Delta t$ is set to be one hour, the minute short circuit cell (lithium ion battery cell) is to have a voltage drop of approximately 4 mV for one hour. In this case, the determination threshold is set to be 4 mV.

When the differential voltage $\Delta V$ calculated is equal to or more than the determination threshold (Y in S15), controller 15 determines that the minute short circuit has occurred in the target cell (S16). When the differential voltage $\Delta V$ calculated is less than the determination threshold (N in S15), controller 15 determines that the minute short circuit has not occurred in the target cell. Process steps described above are repeatedly executed for all the cells included in power storage module M1 while power supply system 1 is in operation (N in S17).

Figure 4:
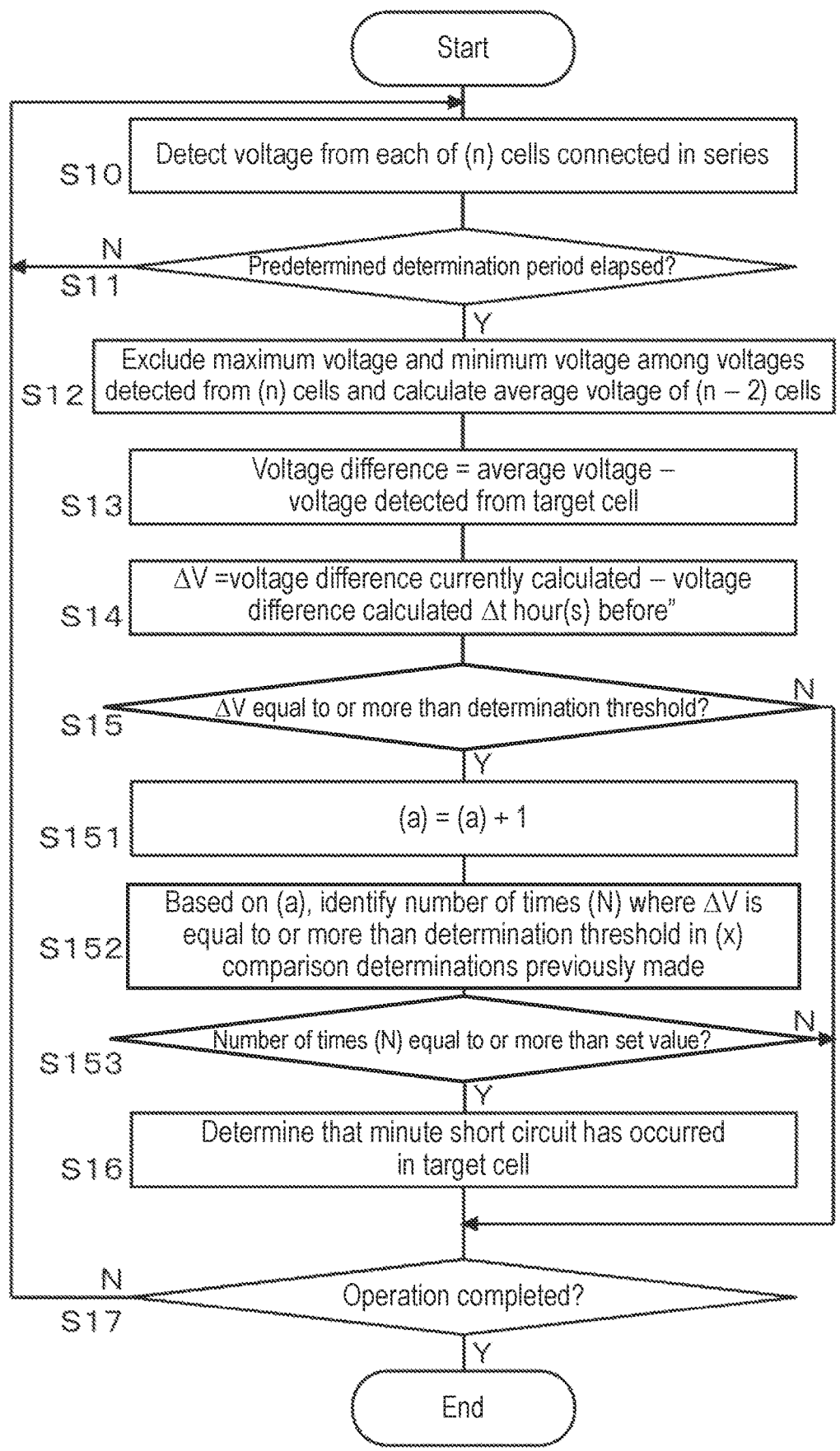
FIG. 4 is a flowchart showing a second reference example of the method for detecting the minute short circuit in the management device according to the exemplary embodiment of the present invention.

FIG. 4 is a flowchart showing a second reference example of the method for detecting the minute short circuit in management device 10 according to the exemplary embodiment of the present invention. Process steps until step S15 are the same as those of the first reference example shown in FIG. 3, and thus a detailed description thereof will be omitted. When the differential voltage $\Delta V$ calculated in step S15 is equal to or more than the determination threshold (Y in S15), controller 15 increments variable a (S151). Note that, an initial value of the variable a is set to be zero. Based on the value of the variable a, controller 15 identifies a number of times N where the differential voltage $\Delta V$ is equal to or more than the determination threshold in x (e.g., 40) comparison determinations previously made (S152).

When the number of times N is equal to or more than a set value (e.g., 30) (Y in S153), controller 15 determines that the minute short circuit has occurred in the target cell (S16). When the number of times N is less than the set value (N in S153), controller 15 determines that the minute short circuit has not occurred in the target cell. By adjusting the value of x and the value of the set value, both described above, it is possible to adjust a balance between a period of time required for detection of the minute short circuit and accuracy in the determination. These two are in a trade-off relationship and thus, when the value of x is larger, the period of time required for detection of the minute short circuit is longer but the determination is more accurate. FIG. 3 shows the first reference example where the period of time required for detection is shortest.

Process steps described above are repeatedly executed for all the cells included in power storage module M1 while power supply system 1 is in operation (N in S17). Note that, in the processes shown in FIGS. 3 and 4, the voltages of the target cells may be included in basic data that is used to calculate the average voltage. Further, the maximum voltage and the minimum voltage are excluded among the voltages detected from the (n) cells but instead, two maximum voltages and two minimum voltages may be excluded. Alternatively, none of the voltages may be excluded among the voltages detected from the (n) cells. In other words, the average voltage may be calculated from the voltages detected from all the (n) cells. Still further, instead of the average value calculated from the voltages detected from the plurality of cells, a median value of the voltages detected from the plurality of cells may be calculated.

The method for detecting the minute short circuit has been described above. In the method, when each of the plurality of cells C1 to C20 is aligned in SOC and SOH with the others, it is possible to detect the minute short circuit at high accuracy. However, when the plurality of cells C1 to C20 vary in SOC and SOH, a fluctuation in the voltage difference between the average voltage and the voltage detected from the target cell is not uniformly detected, and thus, the detection of the minute short circuit is less accurate. In view of this, a method for uniformly evaluating the fluctuation in the voltage difference will be described below. In the method, a linear function/line is specified, and the voltage detected from each of the cells is mapped on the linear function/line in accordance with the SOC and the SOH of the corresponding cell, so that the fluctuation in the voltage differences is uniformly evaluated.

Figure 5:
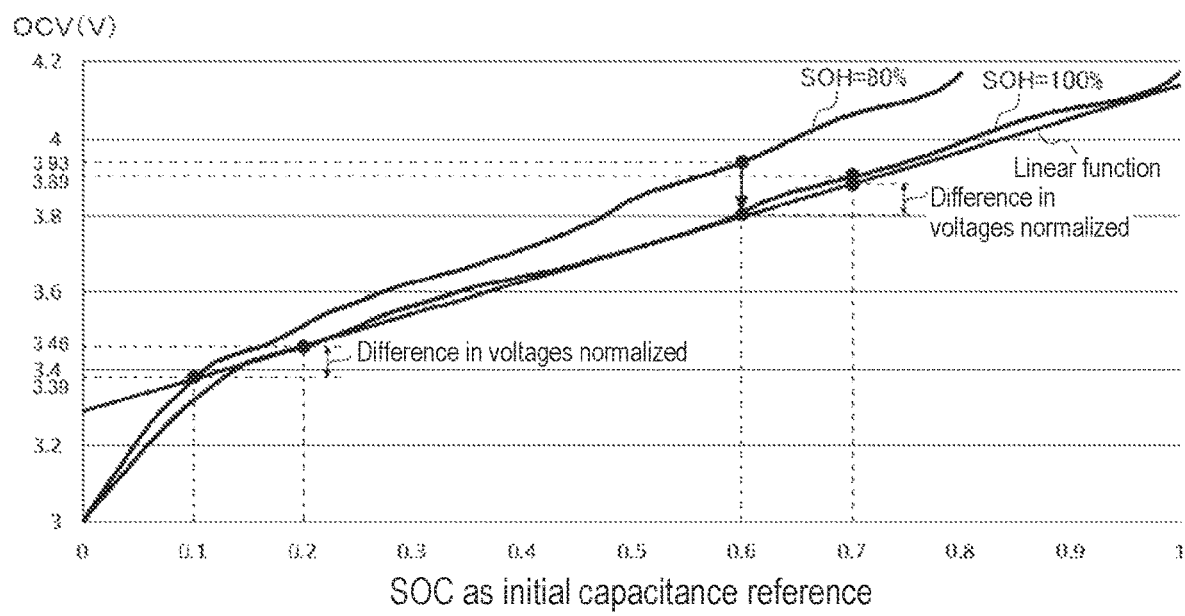
FIG. 5 is a diagram showing an example of an SOC-OCV curve at 80% SOH and an SOC-OCV curve at 100% SOH.

FIG. 5 is a diagram showing an example of an SOC-OCV curve at 80% SOH and an SOC-OCV curve at 100% SOH. In FIG. 5, the horizontal axis represents an SOC as initial capacitance reference, and the vertical axis represents the OCV. The SOC as initial capacitance reference is specified by a ratio of a current SOC to an initial full charge capacity (FCC). In other words, the SOC as initial capacitance reference corresponds to an SOC obtained by normalizing the current SOC against the initial full charge capacity.

In SOC-OCV map 15a, a plurality of SOC-OCV curves may be previously registered, the plurality of SOC-OCV curves at every 1% SOH, at every 5% SOH, or at every 10% SOH for each of the cells used in power storage module M1. When, only the SOC-OCV curve at 100% SOH is registered in SOC-OCV map 15a, controller 15 corrects the SOC-OCV curve at 100% SOH of each of the cells based on the SOH for the corresponding cell, so as to derive an approximate SOC-OCV curve for the corresponding cell. More specifically, controller 15 reduces the SOC-OCV curve at 100% SOH for each of the cells in an X-axis direction in accordance with the SOH of the corresponding cell, so as to derive the approximate SOC-OCV curve for the corresponding cell.

As shown in FIG. 5, the SOC-OCV curve at 80% SOH and at 0.1 SOC as initial capacitance reference is assumed to belong to a first cell; and the SOC-OCV curve at 100% SOH and at 0.2 SOC as initial capacitance reference is assumed to belong to a second cell. In this state, the OCV of the first cell is 3.39 V, and the OCV of the second cell is 3.46 V. The first cell and the second cell are connected in series to each other. When each of the first cell and the second cell is charged with electricity equivalent to 0.5 SOC as initial capacitance reference, the SOC as initial capacitance reference of the first cell increases to 0.6 and the SOC as initial capacitance reference of the second cell increases to 0.7. In this state, the OCV of the first cell rises to 3.93 V, and the OCV of the second cell rises to 3.89 V.

Before being charged with the electricity, the OCV of the second cell is higher than the OCV of the first cell; and after being charged, the OCV of the first cell is higher than the OCV of the second cell. In other words, signs of the voltage difference between these two reverse. This reversal of the signs is caused by a difference in SOH between the first cell and the second cell. Thus, the difference in SOH is to be normalized.

Here, a linear function/line is introduced, the linear function/line using an SOC as initial capacitance reference as an input variable, using an OCV as an output variable, and having a positive inclination. FIG. 5 shows an example where the linear function/line introduced corresponds to a tangent line passing through a point of the 0.5 SOC as initial capacitance reference of the SOC-OCV curve at 100% SOH.

Controller 15 refers to the SOC-OCV curve of each of the cells in accordance with the SOH of the corresponding cell, and estimates the SOC as initial capacitance reference in correspondence to the voltage detected from the corresponding cell. Note that, when power storage module M1 is in charge/discharge at detection of the voltage of each of the cells, the voltage detected is not the OCV but a closed circuit voltage (CCV). As a simple method, the CCV is transmitted through a noise removal filter, and the CCV after noise removal is dealt with as the OCV. As a more precise method, the CCV is corrected based on the current and the internal resistance such that the OCV is estimated. In that case, the internal resistance is preferably corrected based on the temperature, the SOC, and the SOH, so that the OCV is estimated more accurately.

The SOC as initial capacitance reference has been estimated in correspondence to the voltage detected from each of the cells. Controller 15 applies the SOC as initial capacitance reference to the linear function to derive an alternative OCV. Based on the alternative OCV, controller 15 calculates a difference in voltages normalized. In FIG. 5, the OCV of the SOC-OCV curve at 80% SOH and at 0.6 SOC as initial capacitance reference is moved downward, so as to be converted into the OCV of the linear function/line at 0.6 SOC as initial capacitance reference. Further, the OCV of the SOC-OCV curve at 100% SOH and at 0.7 SOC as initial capacitance reference is moved downward, so as to be converted into the OCV of the linear function/line at 0.7 SOC as initial capacitance reference. Then, the voltage difference between these two OCVs, each of which has been converted into that of the linear function/line, is calculated as the difference in the voltages normalized.

The example of FIG. 5 shows no discrepancy between the difference in the voltages normalized before the charge and the difference in the voltages normalized after the charge. Accordingly, controller 15 determines that the minute short circuit has not occurred. On the other hand, when the difference in SOH is not normalized, the example shows a discrepancy between the difference in the voltages before the charge and the difference in the voltages after the charge. Here, despite no occurrence of the minute short circuit, controller 15 may wrongly determine that the minute short circuit has occurred.

The same applies when comparing a difference in the voltages before the discharge with a difference in the voltages after the discharge. As has been described above, by mapping the differences in the voltages, i.e., the difference in voltages before the charge and the difference in voltages after the charge as well as the difference in voltages before the discharge and the difference in voltages after the discharge, on those of the linear function/line, it is possible to absorb the discrepancy between the differences in the SOC-OCV curves of the first cell and the second cell, the discrepancy caused by the difference in SOH between the first cell and the second cell. In other words, the change in SOC of each of the plurality of cells, the change caused by the charge/discharge of the plurality of cells that are connected in series to each other, may be replaced with a linear change where the ratio in SOC between the plurality of cells is maintained. With no occurrence of the minute short circuit, the difference in voltages between the plurality of cells is constant at any segment of the linear change.

Figure 6:
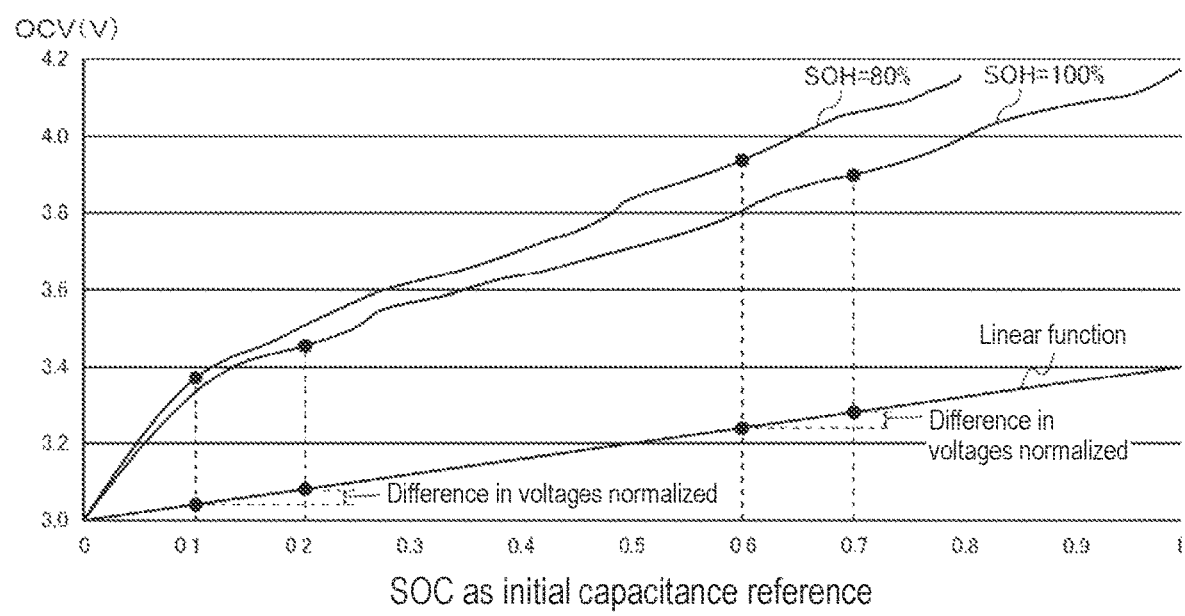
FIG. 6 is a diagram where a linear function/line of FIG. 5 has been repositioned.

FIG. 6 is a diagram where the linear function/line of FIG. 5 has been repositioned. The linear function/line may be introduced at any position as long as the linear function/line has an inclination greater in value than the minimum voltage detected by voltage detector 12. Note that, when the linear function/line has the inclination smaller in value than the minimum voltage detected by voltage detector 12, the fluctuation in voltage differences between the plurality of cells is not detected at high accuracy.

Figure 7:
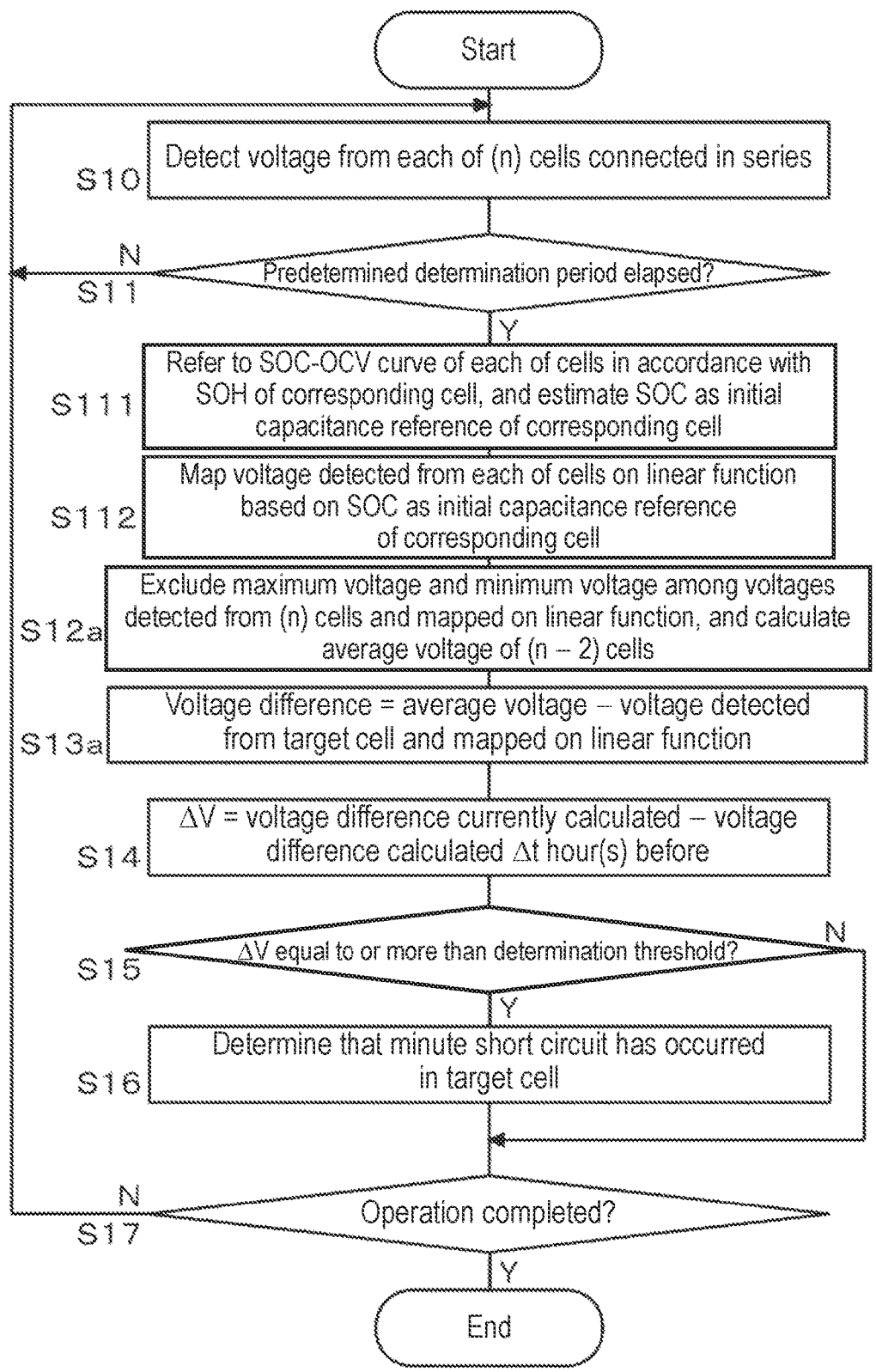
FIG. 7 is a flowchart showing a first example of the method for detecting the minute short circuit in the management device according to the exemplary embodiment of the present invention.

FIG. 7 is a flowchart showing a first example of the method for detecting the minute short circuit in management device 10 according to the exemplary embodiment of the present invention. Voltage detector 12 detects a voltage of each of (n) cells that are connected in series, and transmits the voltage to controller 15 (S10). When a predetermined determination period (e.g., 10 minutes) has elapsed (Y in S11), controller 15 refers to an SOC-OCV curve of each of the (n) cells in accordance with an SOH of a corresponding one of the (n) cells, and estimates an SOC as initial capacitance reference of a corresponding one of the (n) cells (S111). Based on the SOC as initial capacitance reference of each of the (n) cells, controller 15 maps the voltage detected from a corresponding one of the (n) cells on a linear function (S112). Controller 15 excludes a maximum voltage and a minimum voltage among the voltages detected from the (n) cells and mapped on the linear function, and calculates an average voltage of the (n−2) cells (S12a). Controller 15 calculates a voltage difference between the average voltage calculated and the voltage detected from one of the (n) cells to be detected (hereinafter, referred to as a target cell) and mapped on the linear function (S13a).

Controller 15 further calculates a differential voltage $\Delta V$ between the voltage difference currently calculated and a voltage difference that has been calculated for a period of time $\Delta t$ (e.g., one hour) before (S14). Controller 15 compares the differential voltage $\Delta V$ calculated with a determination threshold (S15). The determination threshold is set to a value in accordance with an inclination of the linear function. When the inclination of the linear function is set to be greater, the value of the differential voltage $\Delta V$ is calculated to be greater, and thus, the determination threshold needs to be set to be greater.

When the differential voltage $\Delta V$ calculated is equal to or more than the determination threshold (Y in S15), controller 15 determines that the minute short circuit has occurred in the target cell (S16). When the differential voltage $\Delta V$ calculated is less than the determination threshold (N in S15), controller 15 determines that the minute short circuit has not occurred in the target cell. Process steps described above are repeatedly executed for all the cells included in power storage module M1 while power supply system 1 is in operation (N in S17).

Figure 8:
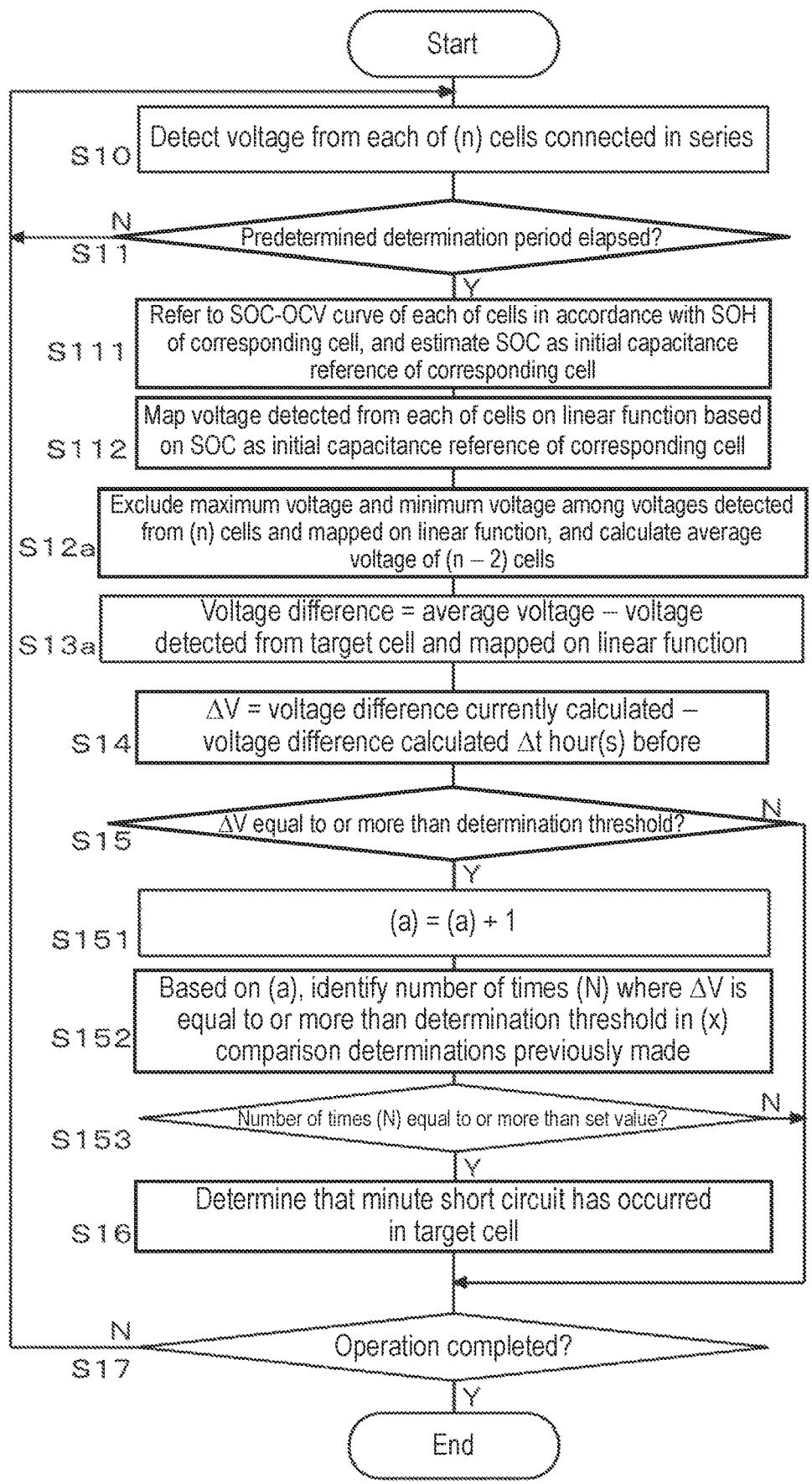
FIG. 8 is a flowchart showing a second example of the method for detecting the minute short circuit in the management device according to the exemplary embodiment of the present invention.

FIG. 8 is a flowchart showing a second example of the method for detecting the minute short circuit in management device 10 according to the exemplary embodiment of the present invention. Process steps until step S15 are the same as those of the first example shown in FIG. 7, and thus a detailed description thereof will be omitted. When the differential voltage $\Delta V$ calculated in step S15 is equal to or more than the determination threshold (Y in S15), controller 15 increments variable a (S151). Note that, an initial value of the variable a is set to be zero. Based on the value of the variable a, controller 15 identifies a number of times N where the differential voltage $\Delta V$ is equal to or more than the determination threshold in x (e.g., 40) comparison determinations previously made (S152).

When the number of times N is equal to or more than a set value (e.g., 30) (Y in S153), controller 15 determines that the minute short circuit has occurred in the target cell (S16). When the number of times N is less than the set value (N in S153), controller 15 determines that the minute short circuit has not occurred in the target cell. Process steps described above are repeatedly executed for all the cells included in power storage module M1 while power supply system 1 is in operation (N in S17).

As has been described above, in this exemplary embodiment, by converting the voltage detected from each of the cells into a value on the linear function/line, it is possible to evaluate based on a common indicator whether or not the minute short circuit has occurred in the corresponding cell, regardless of the SOC or the SOH of the corresponding cell. More specifically, with the horizontal axis representing the SOC as initial capacitance reference of each of the cells, the linear function/line introduced here increases monotonously. Then, the voltage detected from each of the cells is converted into the value on the linear function/line in accordance with the SOC and the SOH of the corresponding cell, and the voltage differences between the plurality of cells are calculated. With no occurrence of the minute short circuit, the differences in the voltages, each normalized as above, do not fluctuate. With an occurrence of the minute short circuit, the differences in the voltages normalized increases uniformly, regardless of the SOC or the SOH of each of the cells.

Further, in this exemplary embodiment, without modifying the determination threshold based on the SOC or the SOH of each of the cells, it is possible to uniformly determine whether or not the minute short circuit has occurred in the corresponding cell.

As has been described above, in this exemplary embodiment, based on limited information, i.e., the SOC, the SOH, and the voltage detected from each of the cells, the voltage detected from the corresponding cell is converted into another value; and with the another value, it is possible to uniformly determine whether or not the minute short circuit has occurred in the corresponding cell, without modifying the determination threshold or the conditions for the determination. Accordingly, it is possible to uniformly and accurately determine, at any phase of the long-term operation of each of the cells, whether or not the minute short circuit has occurred in the corresponding cell, without being required to divide the conditions for the determination into more details.

The present invention has been described above based on the exemplary embodiment. The exemplary embodiment is intended to be illustrative only, and the person of ordinary skill in the art will understand that various modified examples are possible with respect to the combination of configuration elements and processing processes in the exemplary embodiment and that such modifications are also within the scope of the present invention.

Each of FIGS. 5 and 6 shows the example where the linear function having the positive inclination is used, but the linear function may have a negative inclination. In that case, the controller may compare the differential voltage with the determination threshold in a reverse manner (in terms of greater/smaller relation) to the comparisons described above.

As one of the examples in the foregoing exemplary embodiment, the present invention is applied to power supply system 1 for use in a vehicle. Alternatively, the present invention may be applied to a power supply system for stationary power storage. Still alternatively, the present invention may be applied to a power supply system for an electronic device such as a notebook personal computer (PC) or a smartphone.

Note that, the exemplary embodiment may be specified by items described below.

[Item 1]

Management device (10) including:
voltage detector (12) configured to detect a voltage of each of a plurality of cells (C1 to C20) that are connected in series to each other; and
controller (15) configured:
  to calculate, among the voltages detected from the plurality of cells (C1 to C20), a voltage difference between the voltage detected from one cell of the plurality of cells (C1 to C20), the one cell to be detected, and a representative voltage at each of a first time and a second time, the representative voltage based on the voltage detected from at least one cell of the plurality of cells (C1 to C20), the at least one cell to be compared; and
  when a discrepancy between the voltage difference at the first time and the voltage difference at the second time is equal to or more than a threshold, to determine that an abnormality has occurred in the one cell to be detected,
wherein
controller (15) refers to a state-of-charge versus open-circuit-voltage (SOC-OCV) curve of one cell (Cn) to be detected in accordance with a state-of-health (SOH) of one cell (Cn) to be detected, so as to estimate an SOC as initial capacitance reference of one cell (Cn) to be detected in correspondence to the voltage detected from one cell (Cn) to be detected,
controller (15) introduces a linear function using an SOC as initial capacitance reference as an input variable, using an OCV as an output variable, and having an inclination predetermined, and applies the SOC as initial capacitance reference of one cell (Cn) to be detected that controller (15) has estimated to the linear function, so as to derive an OCV, and
in place of the voltage detected from one cell (Cn) to be detected, controller (15) uses the OCV that controller (15) has derived, so as to calculate the voltage difference at the first time and the voltage difference at the second time.

With this configuration, regardless of variation in the SOC or the SOH among the plurality of cells (C1 to C20), it is possible to determine, under uniform conditions, an abnormality in one cell (Cn) to be detected.

[Item 2]

Management device (10) according to item 1, wherein the threshold is set to a value corresponding to a value of the inclination of the linear function.

With this configuration, the threshold is set to the value corresponding to the inclination of the linear function, and thus, it is possible to determine at high accuracy whether or not a minute short circuit has occurred in each of the plurality of cells (C1 to C20).

[Item 3]

Management device (10) according to item 1 or 2, wherein
controller (15) excludes a maximum voltage and a minimum voltage among the voltages detected from the plurality of cells (C1 to C20), and averages the voltages of a rest of the plurality of cells (C1 to C20), so as to calculate the representative voltage.

With this configuration, it is possible to generate a high quality voltage to be compared.

[Item 4]

Management device (10) according to any one of items 1 to 3, wherein
controller (15) calculates, whenever a predetermined period of time has elapsed, the discrepancy between the voltage difference at the first time and the voltage difference at the second time, so as to compare the discrepancy calculated with the threshold, and
when the discrepancy is equal to or more than the threshold for N or more times, where N is an integer of 2 or greater, in x comparisons previously made, where x is an integer of 2 or greater, controller (15) determines that the abnormality has occurred in the one cell to be detected.

With this configuration, it is possible to preferably adjust a balance between a period of time required for detection of the minute short circuit and accuracy in the determination.

[Item 5]

Power supply system (1) including:
a plurality of cells (C1 to C20) that are connected in series to each other; and
management device (10) according to any one of items 1 to 4, management device (10) configured to control the plurality of cells (C1 to C20) that are connected in series to each other.

With this configuration, it is possible to construct power supply system (1) configured to determine the abnormality in each cell (Cn) of the plurality of cells (C1 to C20) under the uniform conditions, regardless of the variation in the SOC or the SOH among the plurality of cells (C1 to C20).

REFERENCE MARKS IN THE DRAWINGS

1: power supply system
M1: power storage module
C1 to C20: cell
Rs: shunt resistor
E1: electromotive force
Ri: internal resistance
R1 to R20: discharge resistor
S1 to S20: discharge switch
Ps: minute short-circuit path
10: management device
11: discharger
12: voltage detector
13: temperature detector
14: current detector
15: controller
15a: SOC-OCV map

The invention claimed is:
1. A management device comprising:
a voltage detector configured to detect a voltage, the voltage being each of voltages detected from a plurality of cells of a power storage module that are connected in series to each other; and a controller configured to calculate at each of a first time and a second time, among the voltages detected from the plurality of cells, a voltage difference between (i) the voltage of one cell to be detected among the plurality of cells and (ii) a representative voltage, the representative voltage being based on the voltage of at least one cell to be compared among the plurality of cells; and when a discrepancy between a voltage difference at the first time and the voltage difference at the second time is equal to or more than a threshold, the controller is configured to determine that an abnormality has occurred in the one cell to be detected, wherein the controller refers to a state-of-charge versus open-circuit-voltage (SOC-OCV) curve of a cell in accordance with a state-of-health (SOH) of the cell, so as to estimate an SOC as initial capacitance reference of the cell in correspondence to the voltage detected from the cell, the controller introduces a linear function using an SOC as initial capacitance reference as an input variable, using an OCV as an output variable, and the linear function having an inclination predetermined, and applies the SOC as initial capacitance reference of the cell that the controller has estimated to the linear function, so as to derive an OCV, and in place of the voltage detected from the cell, the controller uses the OCV that the controller has derived, so as to calculate the voltage difference at the first time and the voltage difference at the second time.

2. The management device according to claim 1, wherein the threshold is set to a value corresponding to a value of the inclination of the linear function.

3. The management device according to claim 1, wherein the controller excludes a maximum voltage and a minimum voltage among the voltages detected from the plurality of cells, and averages a rest of the voltages detected from the plurality of cells, so as to calculate the representative voltage.

4. The management device according to claim 1, wherein
the controller calculates, whenever a predetermined period of time has elapsed, the discrepancy between the voltage difference at the first time and the voltage difference at the second time, so as to compare the discrepancy calculated with the threshold, and when the discrepancy is equal to or more than the threshold for N or more times, where N is an integer of 2 or greater, in x comparisons previously made, where x is an integer of 2 or greater, the controller determines that the abnormality has occurred in the one cell to be detected.

5. A power supply system comprising:
the plurality of cells of a power storage module that are connected in series to each other; and
the management device according to claim 1, the management device configured to manage the plurality of cells that are connected in series to each other.

* * * * *